United States Patent [19]

Rauskolb

[11] 4,330,752
[45] May 18, 1982

[54] POSITION CONTROL CIRCUIT

[75] Inventor: Ruediger F. Rauskolb, Palo Alto, Calif.

[73] Assignee: Optimetrix Corporation, Mountain View, Calif.

[21] Appl. No.: 38,667

[22] Filed: May 14, 1979

[51] Int. Cl.³ .............................................. H03K 5/26
[52] U.S. Cl. ..................................... 328/134; 307/516
[58] Field of Search ................ 328/134, 155; 307/232, 307/233 R, 516

[56] References Cited

U.S. PATENT DOCUMENTS

| | | | |
|---|---|---|---|
| 3,621,352 | 11/1971 | Dinger | 328/134 X |
| 3,866,133 | 2/1975 | Debloois et al. | 307/516 |
| 3,931,585 | 1/1976 | Barker et al. | 328/134 X |
| 3,983,498 | 9/1976 | Malek | 328/155 |
| 4,052,676 | 10/1977 | Crittenden | 328/134 |

Primary Examiner—John S. Heyman

Attorney, Agent, or Firm—Roland I. Griffin

[57] ABSTRACT

A pair of position control circuits is employed for controlling the position of an interferometrically controlled stage along orthogonal X and Y axes of motion of the stage. Each of these position control circuits is provided with a variable phase shifter responsive to a reference signal and a control signal for producing an output signal of the same frequency as the reference signal but shifted in phase as determined by the control signal, and with a phase detector responsive to the output signal from the variable phase shifter and to a measurement signal obtained from the interferometrically controlled stage for producing a position control signal proportional to the difference in phase between those signals. The sum and the difference of the position control signals of selected phase produced by these position control circuits are employed to extend the resolution of the position control circuits.

15 Claims, 2 Drawing Figures

POSITION CONTROL CIRCUIT

BACKGROUND AND SUMMARY OF THE INVENTION

This invention relates generally to control circuits and more particularly to a position control circuit utilizing a phase-locked loop to extend the resolution of the position control circuit.

Position control circuits are employed, for example, to control the position of an interferometrically controlled stage as described in U.S. Patent Application Ser. No. 015,713 entitled INTERFEROMETRICALLY CONTROLLED STAGE WITH PRECISELY ORTHOGONAL AXES OF MOTION, filed on Feb. 27, 1979, by Edward H. Phillips, assigned to the same assignee as the present application, incorporated herein by reference, and now abandoned in favor of continuation Application Ser. No. 198,358 filed on Oct. 20, 1980. Such position control circuits typically employ a reversible or up-down counter to provide an indication of the actual position of the stage as described in U.S. Pat. No. 3,458,259 entitled INTERFEROMETRIC SYSTEM and issued on July 28, 1969. The resolution of such position control circuits is therefore typically limited by the ambiguity of the last or least significant digit indicated by the counter.

Accordingly, it is the principal object of this invention to provide an improved position control circuit in which the ambiguity of the last or least significant digit indicated by the counter is eliminated and the resolution of the position control circuit is extended.

This and other objects, which will become apparent from a reading of this specification and an inspection of the accompanying drawings, are accomplished according to the illustrated preferred embodiment of the present invention by employing a position control circuit having a variable phase shifter responsive to an input reference signal and to a control signal for producing an output signal of the same frequency as the reference signal but shifted in phase as determined by the control signal, and by employing a phase detector responsive to the output signal from the variable phase shifter and to an input measurement signal of a frequency related to the frequency of the input reference signal for producing a position control signal extending the resolution of the position control circuit. The variable phase shifter comprises another phase detector responsive to the input reference signal and to an output signal from a divide by N circuit for driving a voltage controlled oscillator to supply the divide by N circuit with an output signal having a frequency N times greater than the frequency of the reference signal. A shift register is responsive to the output signals from both the voltage controlled oscillator and the divide by N circuit for supplying N output signals of different phase to a data selector. The data selector is responsive to the control signal for supplying a selected one of these N output signals to the first-mentioned phase detector as determined by the control signal.

DESCRIPTION OF THE PREFERRED EMBODIMENT

Figure 1:
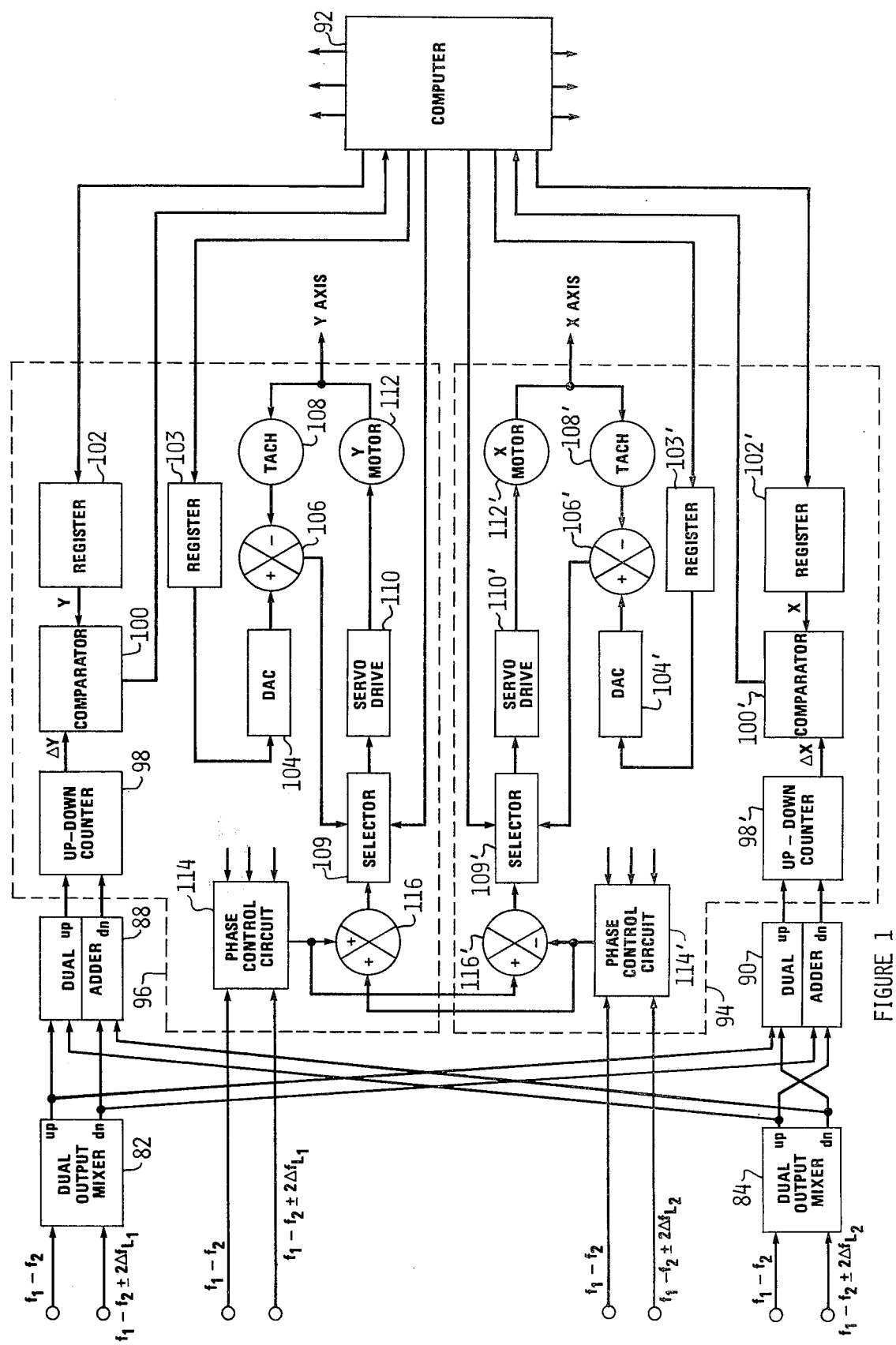
FIG. 1 is a detailed block diagram of a pair of position control circuits constructed in accordance with the preferred embodiment of the present invention and employed, for example, to drive an interferometrically controlled stage.

Referring now to FIG. 1, a first electrical measurement signal of frequency $f_1-f_2\pm2\Delta f_{L1}$ and a second electrical measurement signal of frequency $f_1-f_2\pm2\Delta f_{L2}$ are obtained from first and second interferometer systems, respectively, of an interferometrically controlled stage as shown and described in the above-referenced patent application. A reference signal of frequency $f_1-f_2$ is also obtained from a laser transducer employed with those interferometer systems as further shown and described in that patent application. The first electrical measurement signal of frequency $f_1-f_2\pm2\Delta f_{L1}$ is applied to a first input of a first dual output mixer 82 of the first interferometer system, and the second electrical measurement signal of frequency $f_1-f_2\pm2\Delta f_{L2}$ is applied to a first input of a second dual output mixer 84 of the second interferometer system. Concomitantly, the electrical reference signal of frequency $f_1-f_2$ is applied to a second input of the first dual output mixer 82 and to a second input of the second dual output mixer 84. The first dual output mixer 82 combines the first measurement signal and the reference signal to produce a first pulse train signal having a repetition rate of $2\Delta f_{L1}$ on an up or down output thereof as determined by whether the sign of the $\pm2\Delta f_{L1}$ component of the frequency of the first measurement signal is positive or negative, respectively. The repetition rate of this first pulse train signal is proportional to the velocity of a first movable mirror of the first interferometer system while the first movable mirror is being moved (relative to a first stationary mirror) along a $\Delta L_1$ measurement path of the first interferometer system, as happens whenever an upper platform of the stage is moved along either an X or a Y axis of motion of the stage since the first movable mirror is mounted on the upper platform for movement therewith. Similarly, the second dual output mixer 84 combines the second measurement signal and the reference signal to produce a second pulse train signal having a repetition rate of $2\Delta f_{L2}$ on an up or down output thereof as determined by whether the sign of the $\pm2\Delta f_{L2}$ component of the frequency of the second measurement signal is positive or negative, respectively. The repetition rate of this second pulse train signal is proportional to the velocity of a second movable mirror of the second interferometer system while the second movable mirror is being moved (relative to a second stationary mirror) along a $\Delta L_2$ measurement path of the second interferometer system, as also happens whenever the upper platform of the stage is moved along either the X or the Y axis of motion of the stage since the second movable mirror is also mounted on the upper platform for movement therewith.

Pulses of the first and second pulse train signals appearing on the up outputs of the first and second dual output mixers 82 and 84 are applied to a first pair of inputs of a first dual adder 88, which produces a pulse train representing the sum of those pulses on an up output of the first dual adder. Similarly, pulses of the first and second pulse train signals appearing on the down outputs of the first and second dual output mixers 82 and 84 are applied to a second pair of inputs of the first dual adder 88, which produces a pulse train representing the sum of those pulses on a down output of the first dual adder. The trains of pulses thereby produced on the up and down outputs of the first dual adder 88 represent the sum of the first and second pulse train signals. Pulses of the first pulse train signal appearing on the up output of the first dual output mixer 82 and pulses of the second pulse train signal appearing on the down output of the second dual output mixer 84 are applied to a first pair of inputs of a second dual adder 90, which produces the sum of those pulses on an up output of the second dual adder. Similarly, pulses of the first pulse train signal appearing on the down output of the first dual output mixer 82 and pulses of the second pulse train signal appearing on the up output of the second dual output mixer 84 are applied to a second pair of inputs of the second dual adder 90. The sums of pulses thereby produced on the up and down outputs of the second dual adder 90 represent the difference of the first and second pulse train signals.

In response to the difference and the sum of the first and second pulse train signals and to X and Y digital end point data signals received, for example, from a computer 92, X and Y axes position control circuits 94 and 96 move the upper platform of the stage along orthogonal X and Y axes (with the Y axis bisecting an angle $2\theta$ between the first and second movable mirrors) to precisely position the upper platform of the stage as specified by the X and Y digital end point data signals. These movements of the upper platform of the stage along the orthogonal X and Y axes are effected by the X and Y position control circuits 94 and 96 in accordance with the following equations as hereinafter explained, where $\Delta L_1$ and $\Delta L_2$ are the displacements of the first and second movable mirrors (relative to the first and second stationary mirrors) along the $\Delta L_1$ and $\Delta L_2$ measurement paths of the first and second interferometer systems, respectively, as the upper platform is moved along either the X or the Y axis:

$$\Delta X = K_x(\Delta L_1 - \Delta L_2), \text{ where } K_x = \tfrac{1}{2}\cos\theta; \text{ and} \quad (1)$$

$$\Delta Y = K_y(\Delta L_1 + \Delta L_2), \text{ where } K_y = \tfrac{1}{2}\sin\theta. \quad (2)$$

The orthogonality of the $\Delta X$ and $\Delta Y$ movements of the upper platform of the stage along the X and Y axes of motion of the stage 10 in accordance with equations (1) and (2) is substantiated by the fact that $\Delta X$ is a function of cosine $\theta$, whereas $\Delta Y$ is a function of sine $\theta$, and by the fact that such cosine and sine terms always exist in quadrature.

Since the X and Y axes position control circuits 94 and 96 are identical, the same reference numbers are employed for the same elements of both position control circuits (with those of the X axis position circuit being primed), and only the Y axis position control circuit 96 is described in detail. Pulses appearing on the up and down outputs of the first dual adder 88 are applied to an up-down counter 98 for counting those pulses to produce a $\Delta Y$ digital output signal proportional to the sum ($\Delta L_1 + \Delta L_2$) of the displacements $\Delta L_1$ and $\Delta L_2$ of the first and second movable mirrors (relative to the first and second stationary mirrors) along the $\Delta L_1$ and $\Delta L_2$ measurement paths of the first and second interferometer systems, respectively, as the upper platform of the stage is moved along either the X or the Y axis. In effect, the up-down counter 98 integrates the sum of the velocities of the first and second movable mirrors with respect to time as those velocities are measured by the first and second interferometer systems, respectively, to produce the $\Delta Y$ digital output signal. This $\Delta Y$ digital output signal is applied to one input of a comparator 100, and the Y digital end point data signal from the computer 92 is stored in a register 102 and applied to the other input of the comparator. The comparator 100 produces a digital comparison signal equal to the difference between the digital signals applied thereto and proportional to the distance the upper platform of the stage must be moved along the Y axis to reach the Y axis position specified by the Y digital end point data signal. This digital comparison signal is applied to the computer 92 which in response to a nonzero comparison signal sequentially stores each of a series of digital velocity signals in a register 103. These digital velocity signals and the durations they are stored in register 103 define an optimum profile of accelerating, maximum, and decelerating velocities, as determined in accordance with well known techniques, for the distance the upper platform of the stage is to be moved along the Y axis. Each digital velocity signal stored in the register 103 is applied to a digital-to-analog converter 104 which converts it to an analog voltage signal and applies it to one input of a summing circuit 106. Another analog voltage signal produced by a tachometer 108, as hereinafter explained, is applied to the other input of the summing circuit 106. Thus, the summing circuit 106 produces an output voltage signal equal to the difference between the analog voltage signal from the digital-to-analog converter 104 and the tachometer 108. In response to a nonzero comparison signal from the comparator 100, the computer 92 also activates a selector circuit 109 to apply the output voltage signal from the summing circuit 106 to a servo drive circuit 110 for driving a Y axis servo motor 112. This Y axis servo motor 112 is mounted on the upper platform and reacts against a lower platform of the stage to move the upper platform along the Y axis towards the Y axis position specified by the Y digital end point data signal. The tachometer 108 is coupled to the Y axis servo motor 112 for producing an analog voltage signal proportional to the actual velocity of the Y axis servo motor and applying it to the summing circuit 106. This reduces the output voltage signal from the summing circuit 106 for the purpose of equalizing the actual velocity and the desired velocity of the Y axis servo motor 112.

The up-down counter 98' of the X-axis position control circuit 94 similarly integrates the difference of the velocities of the first and second movable mirrors, as those velocities are measured by the first and second interferometer systems, respectively, to produce a $\Delta X$ digital output signal proportional to the difference ($\Delta L_1 - \Delta L_2$) of the displacements $\Delta L_1$ and $\Delta L_2$ of the first and second movable mirrors (relative to the first and second stationary mirrors) along the $\Delta L_1$ and $\Delta L_2$ measurement paths of the first and second interferometer systems, respectively, while the upper platform of the stage is moved along either the X or the Y axis. In response to this $\Delta X$ digital output signal and an X digital end point data signal stored in the register 102' by the computer 92, the servo drive circuit 110' drives the X axis servo motor 112'. This X axis servo motor 112' is mounted on the lower platform of the stage and reacts against a granite block, on which both the upper and lower platforms are mounted, to move the lower platform and, hence, the upper platform, which is coupled to the lower platform for movement therewith along the X axis, towards the X axis position specified by the X digital end point data signal.

Thus, it may be seen that the upper platform is moved along the orthogonal X and Y axes in accordance with the difference ($\Delta L_1 - \Delta L_2$) and the sum ($\Delta L_1 + \Delta L_2$) of the displacements of the first and second movable mirrors (relative to the first and second stationary mirrors) along the $\Delta L_1$ and $\Delta L_2$ measurement paths of the first and second interferometer systems, respectively, as specified by the corresponding terms of equations (1) and (2) above. In actuality the constants $K_x$ and $K_y$ of those equations may be determined without the necessity of precisely measuring or knowing the half angle $\theta$ between the first and second movable mirrors as described in the above-referenced patent application. The constants $K_x$ and $K_y$, along with other constants such as might be employed to compensate for changes in atmospheric conditions etc., are stored in the computer 92 and utilized in determining a set of pairs of X and Y end point data signals as required to employ the stage in a desired step-and-repeat operation. As each pair of X and Y end point data signals is fed by the computer 92 to the registers 102' and 102 of the X and Y axes position control circuits 94 and 96, the upper platform of the stage is successively stepped along the orthogonal X and Y axes to the position specified by that pair of X and Y end point data signals.

The resolution of the X and Y axes position control circuits 94 and 96 is extended in accordance with the preferred embodiment of the present invention by providing the Y axis position control circuit 96 with a phase control circuit 114 responsive to the reference signal of frequency $f_1 - f_2$, the first measurement signal of frequency $f_1 - f_2 \pm 2\Delta f_{L1}$, and a three bit control or select code signal supplied by the computer 92 in response to a zero comparison signal from the comparator 100 for producing a position control signal as hereinafter described. Similarly, the X axis position control circuit 94 is provided with a phase control circuit 114' responsive to the reference signal of frequency $f_1 - f_2$, the second measurement signal of frequency $f_1 - f_2 \pm 2\Delta f_{L2}$, and another three bit control or select code signal supplied by the computer 92 in response to a zero comparison signal from the comparator 100' for producing another position control signal as hereinafter described. These position control signals are applied to a pair of inputs of a summing circuit 116 (in the Y axis position control circuit 96) for producing an output voltage signal equal to the sum of the position control signals. They are also applied to a pair of inputs of a summing circuit 116' (in the X axis position control circuit 94) for producing an output voltage signal equal to the difference of the position control signals. In response to zero comparison signals from the comparators 100 and 100' the computer 92 activates the selector circuits 109 and 109' to apply the output voltage signals from the summing circuits 116 and 116' to the servo drive circuits 110 and 110', respectively. This drives the Y and X axes servo motors 112 and 112' to move the upper platform of the stage to precisely the desired Y and X axes positions.

Figure 2:
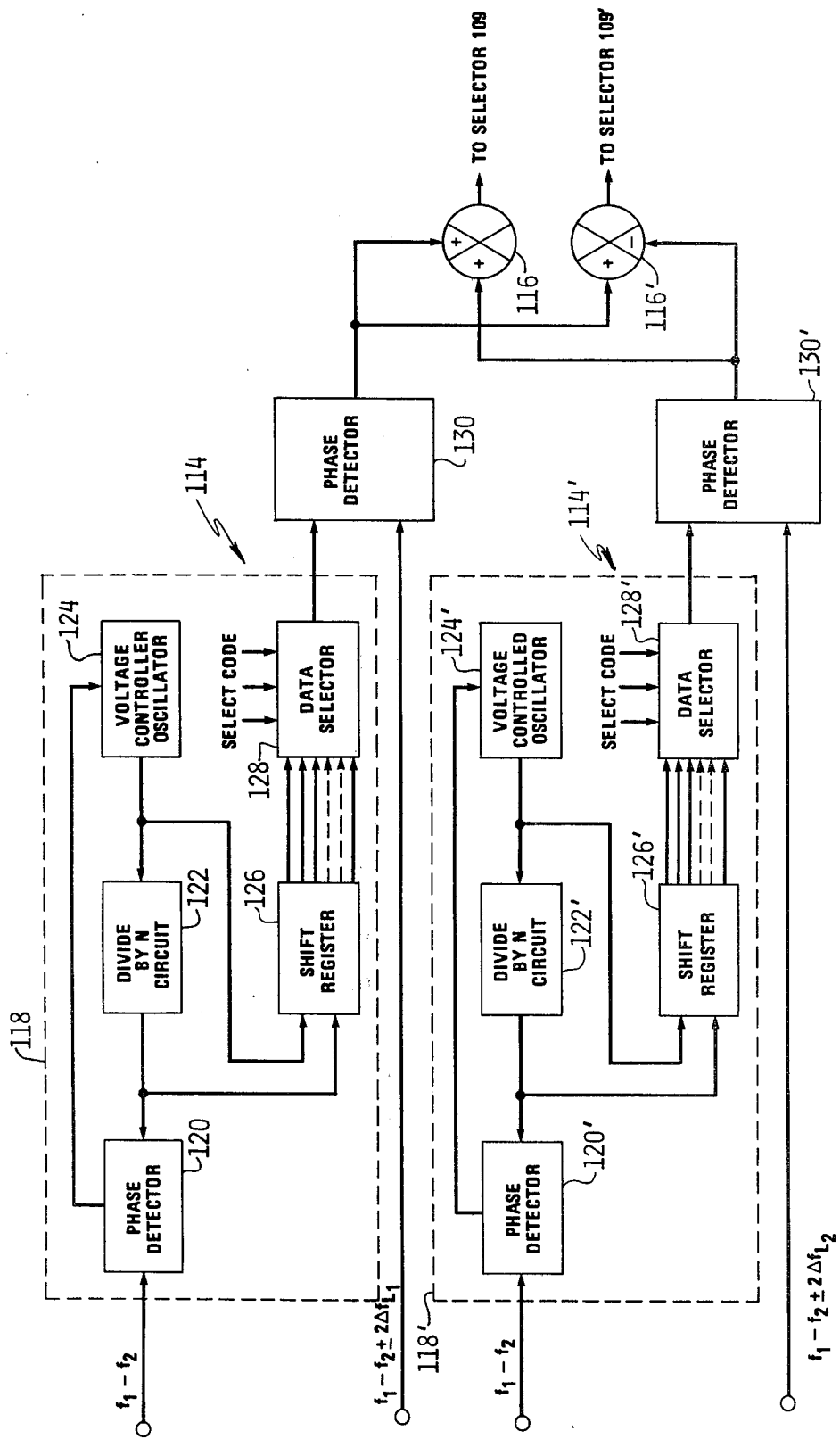
FIG. 2 is a detailed block diagram of a pair of phase control circuits constructed in accordance with the preferred embodiment of the present invention and employed in the position control circuits of FIG. 1.

Referring now to FIG. 2, there is shown a detailed block diagram of the phase control circuits 114 and 114' for the Y and X axes position control circuits 96 and 94, respectively. Since these phase control circuits 114 and 114' are identical, the same reference numbers are employed for the same elements of both phase control circuits (with those of the phase control circuit 114' for the X axis position control circuit 94 being primed), and only the phase control circuit 114 for the Y axis position control circuit 94 is described in detail.

The phase control circuit 114 includes a variable phase shifter 118 for receiving the reference signal of frequency $f_1 - f_2$ and for producing an output signal of the same frequency but shifted in phase as determined by the three bit select code from the computer 92. This phase shifter comprises a phase detector 120 having a first input at which the reference signal of frequency $f_1 - f_2$ is applied and a second input at which an output signal from a divide by N circuit 122 is applied as hereinafter explained. In response to these input signals the phase detector 120 applies an output voltage signal to a voltage controlled oscillator 124 so as to drive the voltage controlled oscillator to produce an output signal having a frequency N times greater than the frequency $f_1 - f_2$ of the reference signal. This output signal from the voltage controlled oscillator 124 is applied both to an input of the divide by N circuit 122 and to a clock input of a shift register 126. The divide by N circuit 122 divides this output signal by N, which for purposes of illustration is herein taken to have a value of eight, and applies the resultant output signal to the second input of the phase detector 120 and also to a data input of the shift register 126. In response to the applied output signals from the divide by N circuit 122 and the voltage controlled oscillator 124, the shift register 126 supplies N (or eight) output signals of different phase (each such output signal differing in phase from the preceding one by 360°/N or 45°) to a data selector 128. The data selector 128 supplies a selected one of these output signals from the shift register 126 to the output of the variable phase shifter 118 as determined by the three bit select code signal supplied by the computer 92 in response to a zero comparison signal from the comparator 100. As indicated above, the selected output signal has the same frequency $f_1 - f_2$ as the reference signal.

The phase control circuit 114 also includes a phase detector 130 having a first input at which the selected output signal (i.e., the output signal with the desired phase shift) of frequency $f_1 - f_2$ from the variable phase shifter 118 is applied and a second input at which the first measurement signal of frequency $f_1 - f_2 \pm 2\Delta f_{L1}$ is applied. In response to these signals the phase detector 130 supplies a position control signal proportional to the difference in phase therebetween to an input of each of the summing circuits 116 and 116' as previously described. Similarly, the variable phase shifter 118' and the phase detector 130' of the phase control circuit 114' are responsive to the reference signal of frequency $f_1 - f_2$, to the other three bit select code signal from the computer 92, and to the second measurement signal of frequency $f_1 - f_2 \pm 2\Delta f_{L2}$ for supplying another position control signal proportional to the difference in phase between the selected output signal from the variable phase shifter 118' and the second measurement signal to the other input of each of the summing circuits 116 and 116'. The difference and the sum of these position control signals are applied to the selector circuits 109' and 109 of the X and Y axes position control circuits 94 and 96, respectively, to extend the resolution of those position control circuits as previously described.

I claim:
1. A position control circuit comprising:
  first means, responsive to a reference signal and to a control signal, for producing an output signal having the same frequency as the reference signal and having a phase determined by the control signal; and second means, coupled to the first means and responsive to the output signal from the first means and to an input signal having a frequency related to the reference signal, for producing a position control signal proportional to the difference in phase between the input signal and the output signal from the first means.

2. A position control circuit as in claim 1 wherein:
said first means comprises a variable phase shifter; and
said second means comprises a phase detector.

3. A position control circuit as in claim 2 wherein said variable phase shifter comprises:
a voltage controlled oscillator for producing an output signal having a frequency N times greater than the frequency of the reference signal;
a division circuit, coupled to the voltage controlled oscillator, for producing an output signal having a frequency equal to the frequency of the output signal from the voltage controlled oscillator divided by N;
another phase detector, coupled to the division circuit and to the voltage controlled oscillator and responsive to the output signal from the division circuit and to the reference signal, for driving the voltage controlled oscillator to produce an output signal having a frequency N times greater than the frequency of the reference signal;
a shift register, coupled to the voltage controlled oscillator and to the last-mentioned phase detector, for producing N output signals of different phase; and
a data selector, coupled to the shift register and to the first-mentioned phase detector and responsive to the control signal, for applying a selected one of the output signals from the shift register as determined by the control signal to the first-mentioned phase detector.

4. A position control circuit comprising:
first means for producing a difference in phase between a reference signal and a related input signal as determined by a control signal; and
second means, coupled to the first means, for producing a position control signal proportional to the difference in phase produced between the reference signal and the input signal.

5. A position control circuit as in claim 4 wherein said input signal has a frequency related to the frequency of the reference signal.

6. A position control circuit as in claim 5 wherein:
said first means is responsive to the reference signal and to the control signal for producing an output signal having the same frequency as the reference signal and having a phase determined by the control signal; and
said second means is coupled to the first means and responsive to the output signal from the first means and to the input signal for producing a position control signal proportional to the difference in phase between the input signal and the output signal from the first means.

7. A position control circuit as in claim 4, 5 or 6 wherein:
said first means comprises a variable phase shifter; and
said second means comprises a phase detector.

8. A position control circuit as in claim 7 wherein said variable phase shifter comprises:
a voltage controlled oscillator for producing an output signal having a frequency N times greater than the frequency of the reference signal;
a division circuit, coupled to the voltage controlled oscillator, for producing an output signal having a frequency equal to the frequency of the output signal from the voltage controlled oscillator divided by N;
another phase detector, coupled to the division circuit and to the voltage controlled oscillator and responsive to the output signal from the division circuit and to the reference signal, for driving the voltage controlled oscillator to produce an output signal having a frequency N times greater than the frequency of the reference signal;
a shift register, coupled to the voltage controlled oscillator and to the last-mentioned phase detector, for producing N output signals of different phase; and
a data selector, coupled to the shift register and to the first-mentioned phase detector and responsive to the control signal, for applying a selected one of the output signals from the shift register as determined by the control signal to the first-mentioned phase detector.

9. A position control circuit as in claim 7 for positioning a utilization device, said position control circuit including:
counter means, responsive to the reference signal and the related input signal, for producing an actual position signal indicative of the actual position of the utilization device;
register means for receiving a desired position signal indicative of a desired position of the utilization device;
comparator means, coupled to the counter means and the register means, for producing a comparison signal equal to the difference between the actual and desired position signals;
control means, coupled to the comparator means, for producing a velocity control signal; and
drive means, responsive to the velocity and position control signals, for moving the utilization device to the desired position.

10. A position control circuit as in claim 9 wherein:
said counter means is also responsive to another input signal for producing the actual position signal, said other input signal also being related to the reference signal;
said circuit includes combining means, coupled to the phase detector, for combining the position control signal with another position control signal that is proportional to a difference in phase between the reference signal and said other input signal to produce a combined position control signal;
said drive means includes a motor for positioning the utilization device, and servo drive means, coupled to the motor, for driving the motor;
said control means includes register means for receiving desired velocity signals, tachometer means for producing an actual velocity signal proportional to the actual velocity of the motor, and comparator means, coupled to the last-mentioned register means and the tachometer means, for producing velocity control signals proportional to the difference between each desired velocity signal and the actual velocity signal; and said drive means further includes selector means, coupled to the last-mentioned comparator means and the combining means, for selectively applying the velocity control signals and the combined position control signal to the servo drive means so as to drive the motor for moving the utilization device to the desired position.

11. A method of processing a reference signal of a first frequency and a displacement input signal of a second frequency related to the frequency of the reference signal to provide a position control signal of extended resolution, said method comprising the steps of:

producing a difference in phase between the reference signal and the displacement input signal as determined by a control signal; and detecting the difference in phase produced between the reference signal and the displacement input signal to generate a position control signal proportional to that difference in phase.

12. A method as in claim 11 further including the step of combining the position control signal with another position control signal that is proportional to a difference in phase between the reference signal and another displacement input signal to generate a combined position control signal equal to the sum or the difference of those position control signals.

13. A position control circuit as in claim 1 wherein:

said first means comprises a variable phase shifter for shifting the phase of the reference signal by a selected amount or an integer multiple thereof as determined by the control signal to produce the output signal; and said second means comprises a phase detector for producing a position control signal proportional to the difference in phase between the input signal and the output signal from the variable phase shifter.

14. A position control circuit as in claim 4 or 5 wherein said first means is operable for producing any one of a set of incremental differences in phase between the reference signal and the input signal as determined by a control signal.

15. A position control circuit as in claim 4 or 5 wherein said first means is operable for varying the difference in phase between the reference signal and the input signal by a selected amount or an integer multiple thereof as determined by the control signal.

* * * * *